(12) United States Patent
Kunitsuka et al.

(10) Patent No.: US 12,073,972 B2
(45) Date of Patent: Aug. 27, 2024

(54) COMMON MODE FILTER

(71) Applicant: TDK Corporation, Tokyo (JP)

(72) Inventors: Kosuke Kunitsuka, Tokyo (JP); Keigo Higashida, Tokyo (JP); Emi Ito, Yamagata (JP); Daisuke Urabe, Tokyo (JP); Yugo Asai, Tokyo (JP)

(73) Assignee: TDK CORPORATION, Tokyo (JP)

( * ) Notice: Subject to any disclaimer, the term of this patent is extended or adjusted under 35 U.S.C. 154(b) by 672 days.

(21) Appl. No.: 17/342,080

(22) Filed: Jun. 8, 2021

(65) Prior Publication Data
US 2021/0391109 A1 Dec. 16, 2021

(30) Foreign Application Priority Data
Jun. 16, 2020 (JP) ................................. 2020-103914

(51) Int. Cl.
*H01F 17/04* (2006.01)
*H01F 17/00* (2006.01)
*H01F 27/28* (2006.01)
*H01F 27/29* (2006.01)
*H01F 27/30* (2006.01)

(52) U.S. Cl.
CPC ....... *H01F 17/045* (2013.01); *H01F 27/2828* (2013.01); *H01F 27/292* (2013.01); *H01F 27/306* (2013.01); *H01F 2017/0093* (2013.01)

(58) Field of Classification Search
CPC .. H01F 17/045; H01F 27/2828; H01F 27/292; H01F 27/306; H01F 2017/0093
See application file for complete search history.

(56) References Cited

U.S. PATENT DOCUMENTS

| | | | | |
|---|---|---|---|---|
| 4,227,143 A | * | 10/1980 | Elders | H01F 38/18 |
| | | | | 363/126 |
| 2014/0167903 A1 | * | 6/2014 | Tomonari | H01F 17/045 |
| | | | | 336/220 |
| 2017/0069418 A1 | * | 3/2017 | Yamakita | H01F 27/29 |
| 2017/0294264 A1 | * | 10/2017 | Hashimoto | H01F 17/045 |
| 2017/0301455 A1 | * | 10/2017 | Kobayashi | H01F 27/2823 |
| 2018/0211764 A1 | * | 7/2018 | Komaya | H01F 17/04 |
| 2019/0228901 A1 | * | 7/2019 | Asai | H01F 27/006 |
| 2020/0005981 A1 | * | 1/2020 | Takezawa | H01F 27/2823 |

FOREIGN PATENT DOCUMENTS

| | | | | |
|---|---|---|---|---|
| JP | 2011253888 A | * | 12/2011 | |
| JP | 2019-121791 A | | 7/2019 | |
| JP | 2019121791 A | * | 7/2019 | ............. H01F 17/04 |

OTHER PUBLICATIONS

Notification of grant, State IP Office of PRC, May 2, 2023 (Year: 2023).*

* cited by examiner

*Primary Examiner* — Malcolm Barnes
(74) *Attorney, Agent, or Firm* — Rimon P.C.

(57) ABSTRACT

Disclosed herein is a common mode filter that includes first and second wires wound in the same direction around the winding core part. The first and second wires have first to third layer winding portions, a first crossing portion positioned between the first and third layer winding portions, and a second crossing portion positioned between the second and third layer winding portions. The vertical positions of the first and second wires are reversed at least partially between the first and third layer winding portions, and the vertical positions of the first and second wires are reversed at least partially between the second and third layer winding portions.

16 Claims, 6 Drawing Sheets

COMMON MODE FILTER

BACKGROUND OF THE INVENTION

Field of the Invention

The present invention relates to a common mode filter and, more particularly, to a common mode filter of a type in which a pair of wires cross each other along the way and a manufacturing method therefor.

Description of Related Art

A common mode filter is widely used in many electronic devices, such as mobile electronic devices and on-vehicle LANs, as an element for removing common mode noise superimposed on differential signal lines. In recent years, a common mode filter using a surface-mountable drum core supersedes a common mode filter using a toroidal core (see JP 2019-121791A).

In a common mode filter described in JP 2019-121791A, a pair of wires are made to cross each other an even number of times along the way to enhance the symmetry of differential signals in high frequency regions. In recent years, it has been demanded to sufficiently reduce mode conversion characteristics indicating a rate at which a differential signal component is converted into a common mode noise component in high frequency regions. One of the major factors that degrade the mode conversion characteristics is a disturbance in the symmetry of a pair of wires. Thus, by enhancing the symmetry of a pair of wires as in the common mode filter described in JP 2019-121791A, the mode conversion characteristics in high frequency regions can be improved.

Studies conducted by the present inventors reveal that the degradation in the mode conversion characteristics due to disturbance of a pair of wire is more conspicuous in turns closer to the input side of differential signals. Thus, in the configuration of the common mode filter described in JP 2019-121791A, in which a pair of wires are made to cross each other after winding of several turns from the wire end portion, it is difficult to sufficiently improve the mode conversion characteristics in high frequency regions.

SUMMARY

It is therefore an object of the present invention to sufficiently improve the mode conversion characteristics in high frequency regions in a common mode filter in which a pair of wires cross each other along the way.

A common mode filter according to the present invention includes: a core having a winding core part, a first flange part provided at one axial end of the winding core part, and a second flange part provided at the other axial end of the winding core part; first and second wires wound in the same direction around the winding core part; first and second terminal electrodes provided on the first flange part and connected respectively with one ends of the first and second wires; and third and fourth terminal electrodes provided on the second flange part and connected respectively with the other ends of the first and second wires. The first and second wires have a first layer winding portion in which the first and second turns thereof counted respectively from one ends are at least partially wound by layer winding in an aligned state, a second layer winding portion in which the first and second turns thereof counted respectively from the other ends are at least partially wound by layer winding in an aligned state, a third layer winding portion in which at least parts of the first and second wires between the third turns thereof counted respectively from the one ends and the third turns thereof counted respectively from the other ends are wound by layer winding in an aligned state, a first crossing portion positioned between the first and third layer winding portions, at which the first and second wires cross each other, and a second crossing portion positioned between the second and third layer winding portions, at which the first and second wires cross each other. The vertical positions of the first and second wires are reversed at least partially between the first and third layer winding portions, and the vertical positions of the first and second wires are reversed at least partially between the second and third layer winding portions.

According to the present invention, the second turns of the pair of wires cross each other, so that mode conversion characteristics in high frequency regions can be improved. In addition, the pair of wires cross each other at both end portions thereof, so that bidirectional mode conversion characteristics can be improved in a configuration in which differential signals are bidirectionally transmitted. Further, the pair of wires are wound by layer winding as a whole, allowing a reduction in the length of the winding core part in the x-direction.

In the present invention, the first flange part may have a first surface covered with connection portions of the first and second terminal electrodes at which one ends of the first and second wires are respectively connected, and the second flange part may have a second surface covered with connection portions of the third and fourth terminal electrodes at which the other ends of the first and second wires are respectively connected, the winding core part may have a winding surface parallel to the first and second surfaces, and first and second crossing portions may be both positioned on the winding surface. With this configuration, the wire length from the first and second terminal electrodes to the first crossing portion and the wire length from the third and fourth terminal electrodes to the second crossing portion are substantially equal to each other, making it possible to reduce the difference in the mode conversion characteristics due to the difference in input direction of differential signals.

In the present invention, the third layer winding portion may have a fourth layer winding portion positioned on the side close to the first layer winding portion and a fifth layer winding portion positioned on the side close to the second layer winding portion, the first and second wires may further have a third crossing portion positioned between the fourth and fifth layer winding portions, at which the first and second wires cross each other, and the vertical positional relationship between the first and second wires in the first and fifth layer winding portions and the vertical positional relationship therebetween in the second and fourth layer winding portions may be reversed. This further enhance the symmetry between the first and second wires. In this case, to further enhance the symmetry between the first and second wires, the difference in the number of turns between the fourth and fifth layer winding portions is preferably one or less.

In the present invention, the third layer winding portion may have a fourth layer winding portion positioned on the side close to the first layer winding portion, a sixth layer winding portion positioned on the side close to the second layer winding portion, and a fifth layer winding portion positioned between the fourth and sixth layer winding portions, the first and second wires may further have a third crossing portion positioned between the fourth and fifth layer winding portions, at which the first and second wires cross each other and a fourth crossing portion positioned between the fifth and sixth layer winding portions, at which the first and second wires cross each other, and the vertical positional relationship between the first and second wires in the first, second, and fifth layer winding portions and the vertical positional relationship therebetween in the fourth and sixth layer winding portions may be reversed. This can further enhance the symmetry between the first and second wires and can reduce a parasitic capacitance component. In this case, to further enhance the symmetry between the first and second wires, it is preferable to make the numbers of turns in the fourth and sixth layer winding portions the same, and it is more preferable to make the numbers of turns in the fourth, fifth, and sixth layer winding portions the same.

Thus, according to the present invention, the mode conversion characteristics in high frequency regions can be improved in a common mode filter in which a pair of wires cross each other along the way.

BRIEF DESCRIPTION OF THE DRAWINGS

The above features and advantages of the present invention will be more apparent from the following description of certain preferred embodiments taken in conjunction with the accompanying drawings, in which.

BRIEF DESCRIPTION OF THE DRAWINGS

Hereinafter, a preferred embodiment of the present invention will be described in detail with reference to the accompanying drawings.

Figure 1:
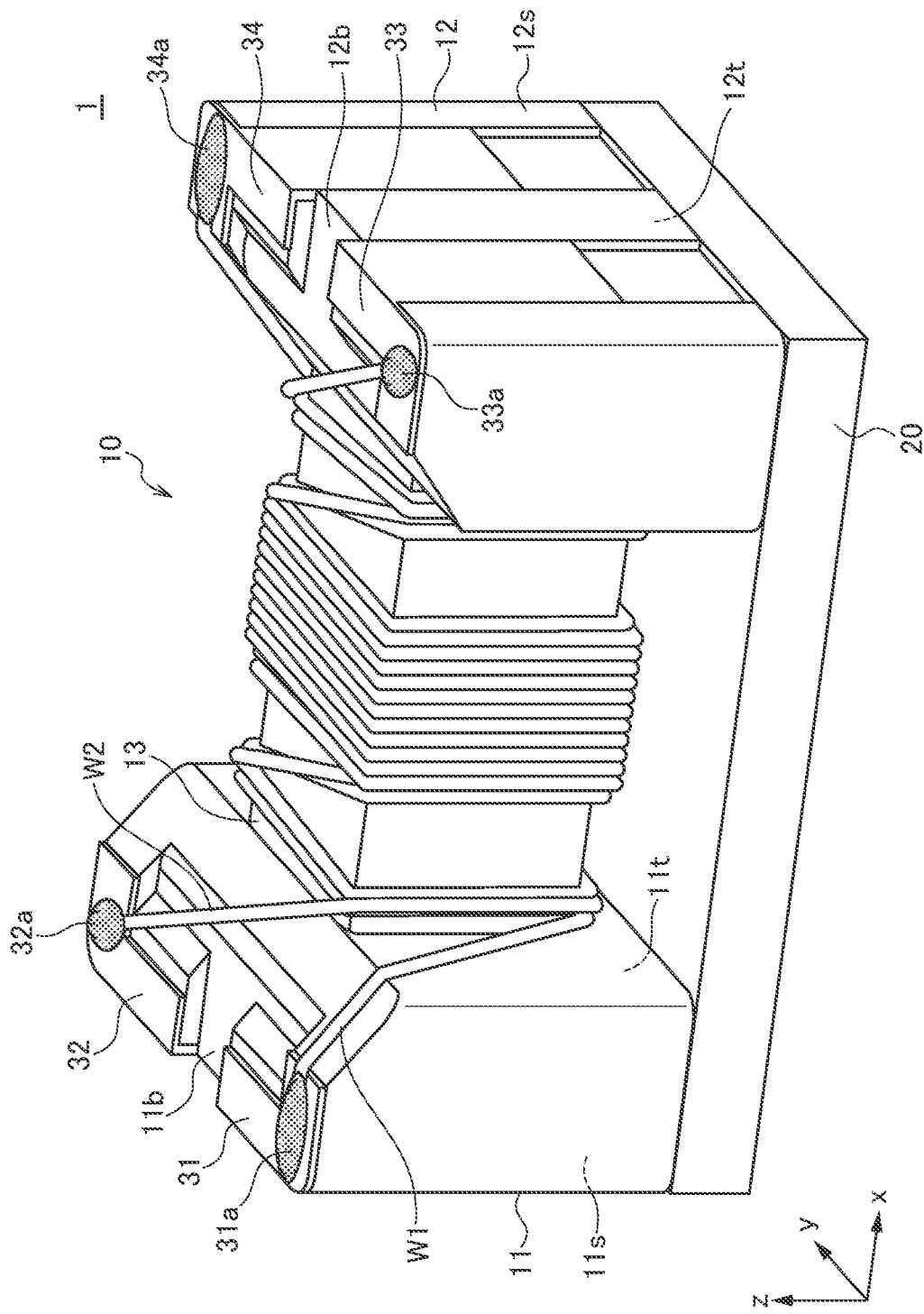
FIG. 1 is a schematic perspective view illustrating the outer appearance of a common mode filter 1 according to a first embodiment of the present invention.

FIG. 1 is a schematic perspective view illustrating the outer appearance of a common mode filter 1 according to a first embodiment of the present invention.

As illustrated in FIG. 1, the common mode filter 1 according to the first embodiment includes a drum core 10, a plate core 20, first to fourth terminal electrodes 31 to 34, and first and second wires W1 and W2. The drum core 10 and plate core 20 are each made of a magnetic material such as an Ni—Zn based ferrite. The first to fourth terminal electrodes 31 to 34 are each a metal fitting made of a good conductor material such as copper. The first to fourth terminal electrodes 31 to 34 may be obtained by directly baking silver paste or the like onto the drum core 10.

The drum core 10 has a first flange part 11, a second flange part 12, and a winding core part 13 disposed between the first and second flange parts 11 and 12. The winding core part 13 has its axis direction in the x-direction. The first and second flange parts 11 and 12 are disposed at axial both ends of the winding core part 13 and integrally formed with the winding core part 13. The plate core 20 is bonded to upper surfaces 11t and 12t of the respective flange parts 11 and 12. The upper surfaces 11t and 12t of the respective flange parts 11 and 12 constitute the xy plane, and their opposite surfaces are used as mounting surfaces 11b and 12b. The first and second terminal electrodes 31 and 32 are each provided on the mounting surface 11b of the first flange part 11 and an outer surface 11s thereof, and the third and fourth terminal electrodes 33 and 34 are each provided on the mounting surface 12b of the second flange part 12 and an outer surface 12s thereof. The outer surfaces 11s and 12s each constitute the yz plane. Fixation of the first to fourth terminals 31 to 34 is made by using an adhesive or the like.

The first and second wires W1 and W2 are wound around the winding core part 13 in the same direction. One and the other ends of the first wire W1 are connected respectively to connection portions 31a and 33a of the first and third terminal electrodes 31 and 33, and one and the other ends of the second wire W2 are connected respectively to connection portions 32a and 34a of the second and fourth terminal electrodes 32 and 34. The number of turns of the first wire W1 and the number of turns of the second wires W2 are the same. The connection portions 31a and 32a of the first and second terminal electrodes 31 and 32 are positioned on the mounting surface 11b, and connection portions 33a and 34a of the third and fourth terminal electrodes 33 and 34 are positioned on the mounting surface 12b.

Figure 2:
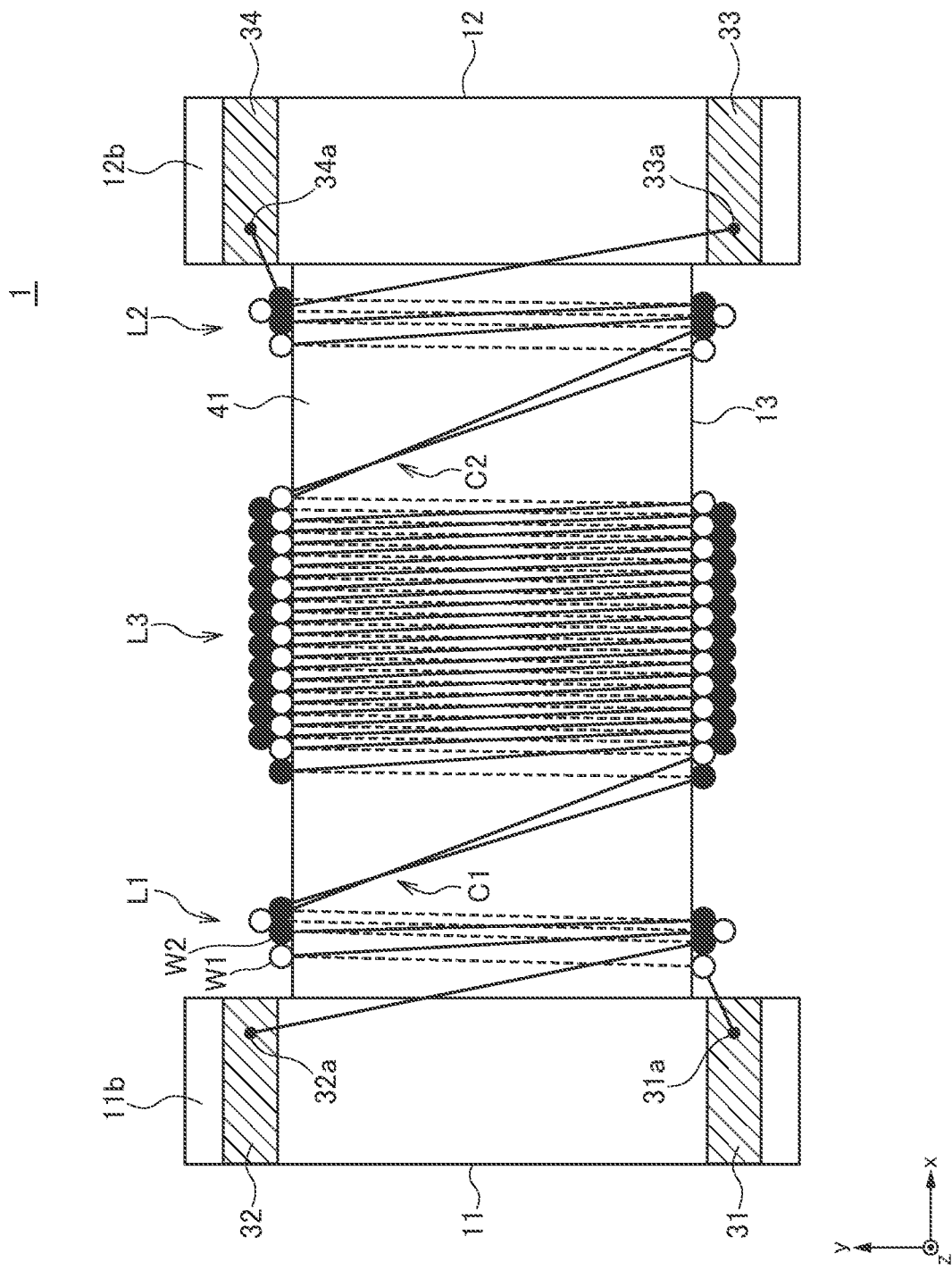
FIG. 2 is a schematic plan view for explaining the winding layout of the first and second wires W1 and W2 in a common mode filter 1.
Figure 3:
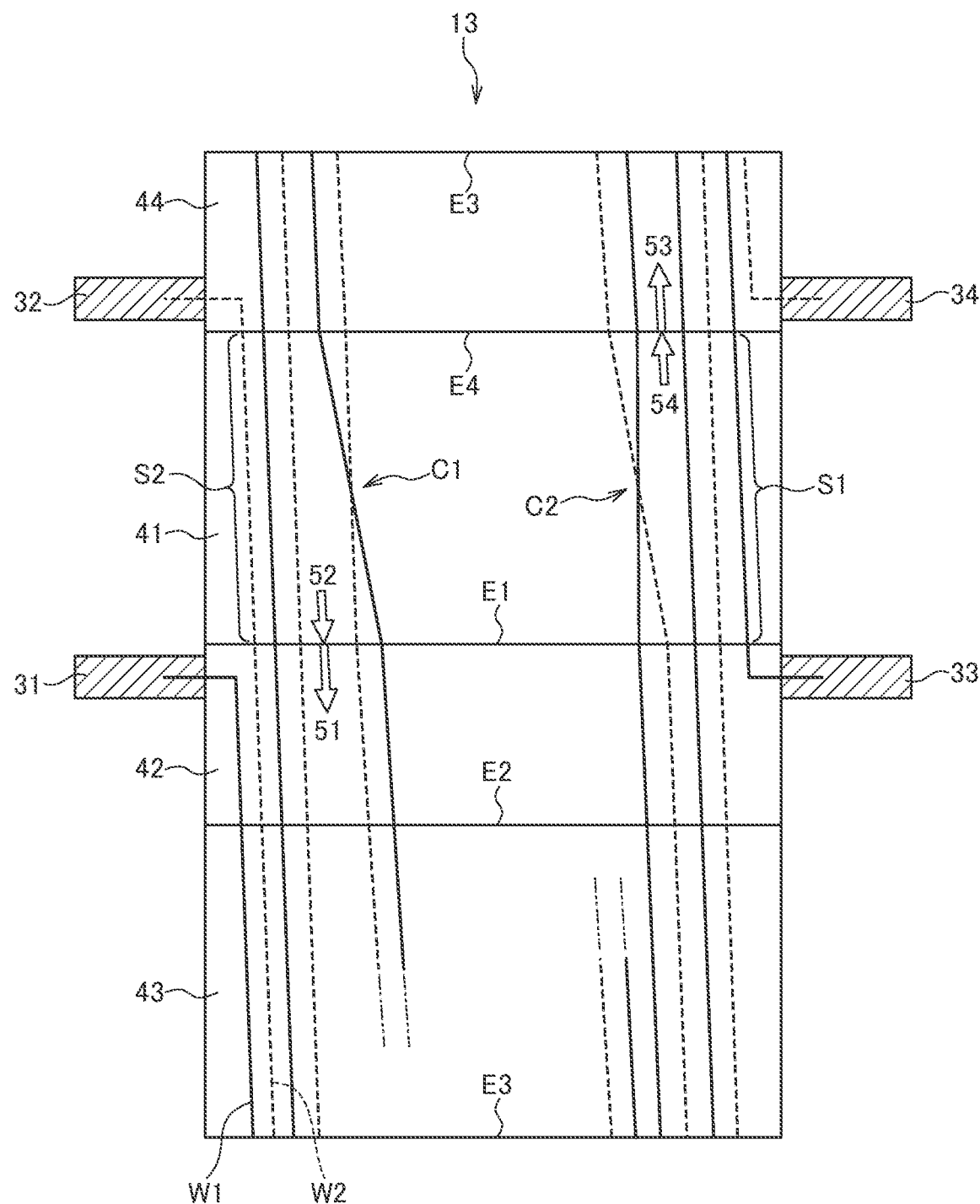
FIG. 3 is a schematic developed view for explaining the winding layout of the first and second wires W1 and W2 in a common mode filter 1.

FIG. 2 is a schematic plan view for explaining the winding layout of the first and second wires W1 and W2. FIG. 3 is a schematic developed view for explaining the winding layout of the first and second wires W1 and W2.

In the present embodiment, the winding core part 13 has a substantially rectangular shape in yz cross section and has four winding surfaces 41 to 44 as illustrated in FIG. 3. The winding surfaces 41 and 43 constitute the xy plane, and the winding surfaces 42 and 44 constitute the xz plane. The boundary between the winding surfaces 41 and 42 is defined by an edge E1, the boundary between the winding surfaces 42 and 43 is defined by an edge E2, boundary between the winding surfaces 43 and 44 is defined by an edge E3, and the boundary between the winding surfaces 44 and 41 is defined by an edge E4.

As illustrated in FIGS. 2 and 3, the first and second wires W1 and W2 have a first layer winding portion L1 in which the first and second turns thereof counted respectively from the connection portions 31a and 32a are wound by layer winding in an aligned state, a second layer winding portion L2 in which the first and second turns thereof counted respectively from the connection portions 33a and 34a are wound by layer winding in an aligned state, and a third layer winding portion L3 in which parts of the first and second wires W1 and W2 between the third turns thereof counted respectively from the connection portions 31a and 32a and the third turns thereof counted respectively from the connection portions 33a and 34a are wound by layer winding in an aligned state. Thus, the first and second wires W1 and W2 are wound by layer winding as a whole, so that even when the numbers of turns of the first and second wires W1 and W2 are large, the length of the winding core part 13 in the x-direction can be reduced. Further, the first and second wires W1 and W2 have a first crossing portion C1 positioned between the first and third layer winding portions L1 and L3, at which the first and second wires W1 and W2 cross each other and a second crossing portion C2 positioned between the second and third layer winding portions L2 and L3, at which the first and second wires W1 and W2 cross each other. The positional relationship between the first and second wires W1 and W2 is reversed before and after the crossing.

The first turns of the first and second wires W1 and W2 counted from one ends thereof are each defined by a section starting at the edge E1 (denoted by the arrow 51) and ending at the edge E1 (denoted by the arrow 52). The same applies to the second and subsequent turns. This is because the terminal electrodes 31 and 32 are disposed offset in the negative y-direction and in the positive y-direction, respectively, as viewed from the center axis of the winding core part 13, so that the first wire W1 paired with the second wire W2 does not exist in a section S2 of the second wire W2 positioned on the winding surface 41. Similarly, the first turns of the first and second wires W1 and W2 counted from the other ends thereof are each defined by a section starting at the edge E4 (denoted by the arrow 53) and ending at the edge E4 (denoted by the arrow 54). The same applies to the second and subsequent turns. This is because the terminal electrodes 33 and 34 are disposed offset in the negative y-direction and in the positive y-direction, respectively, as viewed from the center axis of the winding core part 13, so that the first wire W2 paired with the first wire W1 does not exist in a section S1 of the first wire W1 positioned on the winding surface 41.

In the first and second layer winding portions L1 and L2, the first and second wires W1 and W2 are wound by layer winding in an aligned state with the second wire W2 positioned in the lower layer and the first wire W1 positioned in the upper layer. On the other hand, in the third layer winding portion L3, the first and second wires W1 and W2 are wound by layer winding in an aligned state with the first wire W1 positioned in the lower layer and the second wire W2 positioned in the upper layer. Although the number of turns in the third layer winding portion L3 is 12 in the example of FIG. 2, it is not particularly limited. To achieve the layer winding of the first and second wires W1 and W2 in an aligned state, the wire in the upper layer needs to be wound along the valley line formed by adjacent turns of the wire in the lower layer, so that the number of turns of the wire in the upper layer is smaller by one than the number of turns of the wire in the lower layer. Thus, in the first layer winding portion L1, the first turn of the first wire W1 counted from the connection portion 31a is exceptionally positioned in the lower layer; in the third layer winding portion L3, the third turn of the second wire W2 counted from the connection portion 32a is exceptionally positioned in the lower layer; and in the second layer winding portion L2, the second turn of the first wire W1 counted from the connection portion 33a is exceptionally positioned in the lower layer.

As described above, in the common mode filter 1 according to the present embodiment, the second turns of the first and second wires W1 and W2 counted from one ends thereof connected respectively to the terminal electrodes 31 and 32 cross each other, and the second turns of the first and second wires W1 and W2 counted from the other ends thereof connected respectively to the terminal electrodes 33 and 34 cross each other. When the first and second wires W1 and W2 are made to cross each other, symmetry therebetween before and after the crossing is enhanced to improve the mode conversion characteristics. As described above, deterioration in the mode conversion characteristics due to disturbance of the symmetry is more conspicuous in turns closer to the input side of differential signals; however, in the common mode filter 1 according to the present embodiment, the second turns of the first and second wires W1 and W2 cross each other, so that the mode conversion characteristics in high frequency regions are significantly improved. In addition, the crossing portions C1 and C2 are positioned at both end portions of the first and second wires W1 and W2, so that it is possible to provide a common mode filter having no directivity and to improve the signal quality of bidirectional differential signals.

Further, the first and second turns of the first and second wires W1 and W2 counted from the respective ends thereof are wound by layer winding, so that the length of the winding core part 13 in the x-direction can be reduced as compared to a case where the wires are bifilar wound. In addition, the vertical positional relationship between the first and second wires W1 and W2 in the first and second layer winding portions L1 and L2 and the vertical positional relationship therebetween in the third layer winding portion L3 are reversed, thus reducing the difference in length between the first and second wires W1 and W2.

Further, the crossing portions C1 and C2 are both positioned on the winding surface 41. Thus, the length of the first wire W1 positioned between the first terminal electrode 31 and the first crossing portion C1 and the length of the second wire W2 positioned between the fourth terminal electrode 34 and the second crossing portion C2 are substantially coincide with each other, and the length of the second wire W2 positioned between the second terminal electrode 32 and the first crossing portion C1 and the length of the first wire W1 positioned between the third terminal electrode 33 and the second crossing portion C2 substantially coincide with each other. As a result, there is little difference between the mode conversion characteristics when the first and second terminal electrodes 31 and 32 are set as an input side and the mode conversion characteristics when the third and fourth terminal electrodes 33 and 34 are set as an input side.

Figure 4:
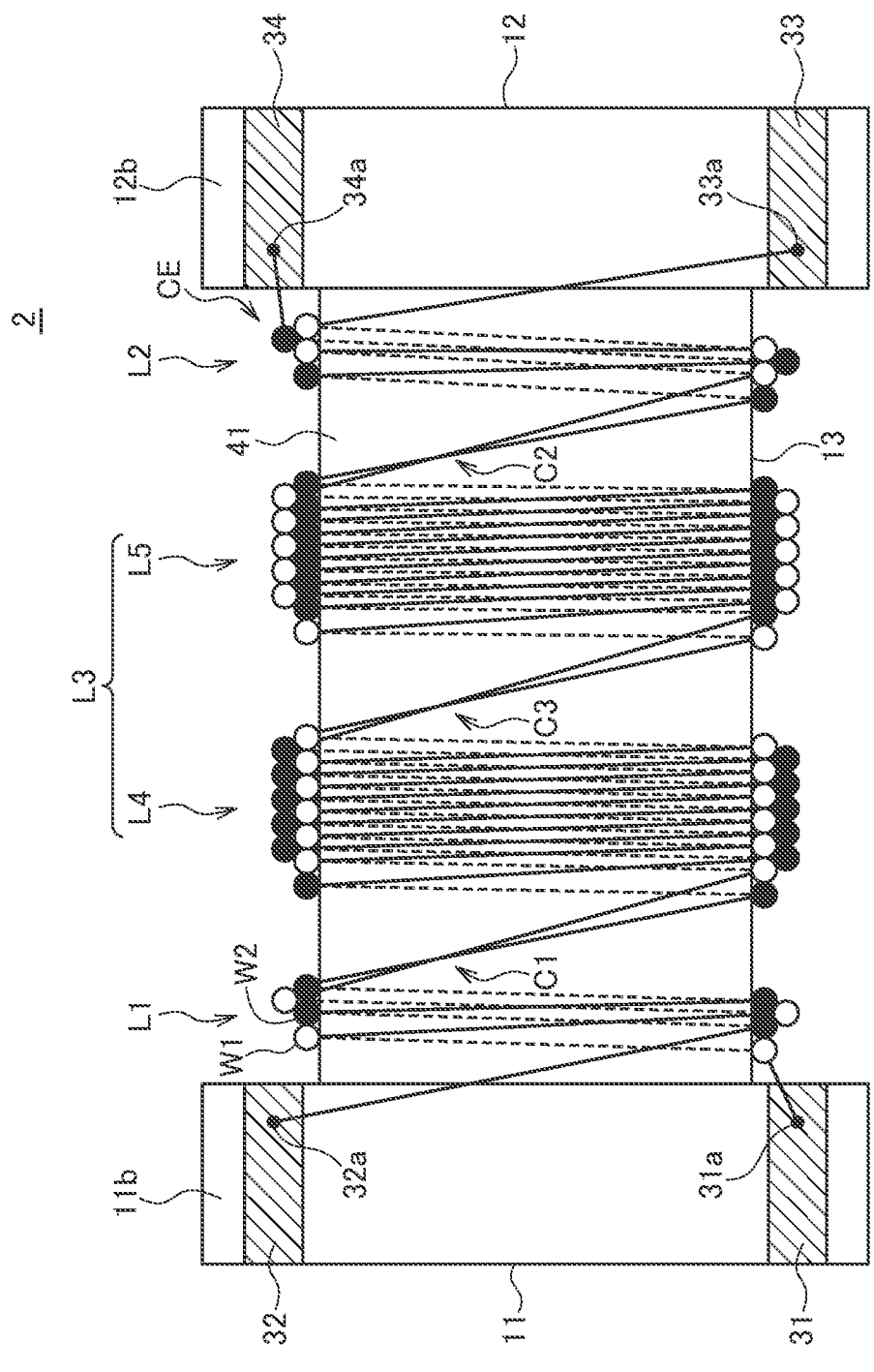
FIG. 4 is a schematic plan view for explaining the winding layout of the first and second wires W1 and W2 in a common mode filter 2 according to a second embodiment of the present invention.

FIG. 4 is a schematic plan view for explaining the winding layout of the first and second wires W1 and W2 in a common mode filter 2 according to a second embodiment.

As illustrated in FIG. 4, the common mode filter 2 according to the second embodiment differs from the common mode filter 1 according to the first embodiment in that the third layer winding portion L3 is divided into a fourth layer winding portion L4 and a fifth layer winding portion L5 and that a third crossing portion C3 is provided between the fourth and fifth layer winding portions L4 and L5. Other basic configurations are the same as those of the common mode filter 1 according to the first embodiment, so the same reference numerals are given to the same elements, and overlapping description will be omitted.

In the first and fifth layer winding portions L1 and L5, the first and second wires W1 and W2 are wound by layer winding in an aligned state with the second wire W2 positioned in the lower layer and the first wire W1 positioned in the upper layer, whereas in the second and fourth layer winding portions L2 and L4, the first wire W1 is positioned in the lower layer and the second wire W2 is positioned in the upper layer. Although the number of turns in each of the layer winding portions L4 and L5 is six in the example of FIG. 4, it is not particularly limited. In the first layer winding portion L1, the first turn of the first wire W1 counted from the connection portion 31a is exceptionally positioned in the lower layer; in the fourth layer winding portion L4, the third turn of the second wire W2 counted from the connection portion 32a is exceptionally positioned in the lower layer; in the fifth layer winding portion L5, the ninth turn of the first wire W1 counted from the connection portion 31a is exceptionally positioned in the lower layer; and in the second layer winding portion L2, the second turn of the second wire W2 counted from the connection portion 34a is exceptionally positioned in the lower layer.

Thus, in the common mode filter 2 according to the second embodiment, the third layer winding portion L3 is divided into the fourth and fifth layer winding portions L4 and L5, and the vertical positions of the first and second wires W1 and W2 are revered between the fourth and fifth layer winding portions L4 and L5, allowing the lengths of the first and second wires W1 and W2 to substantially coincide with each other. In addition, the first and second wires W1 and W2 cross each other between the fourth and fifth layer winding portions L4 and L5, allowing the symmetry between the first and second wires W1 and W2 to be further enhanced.

Figure 5:
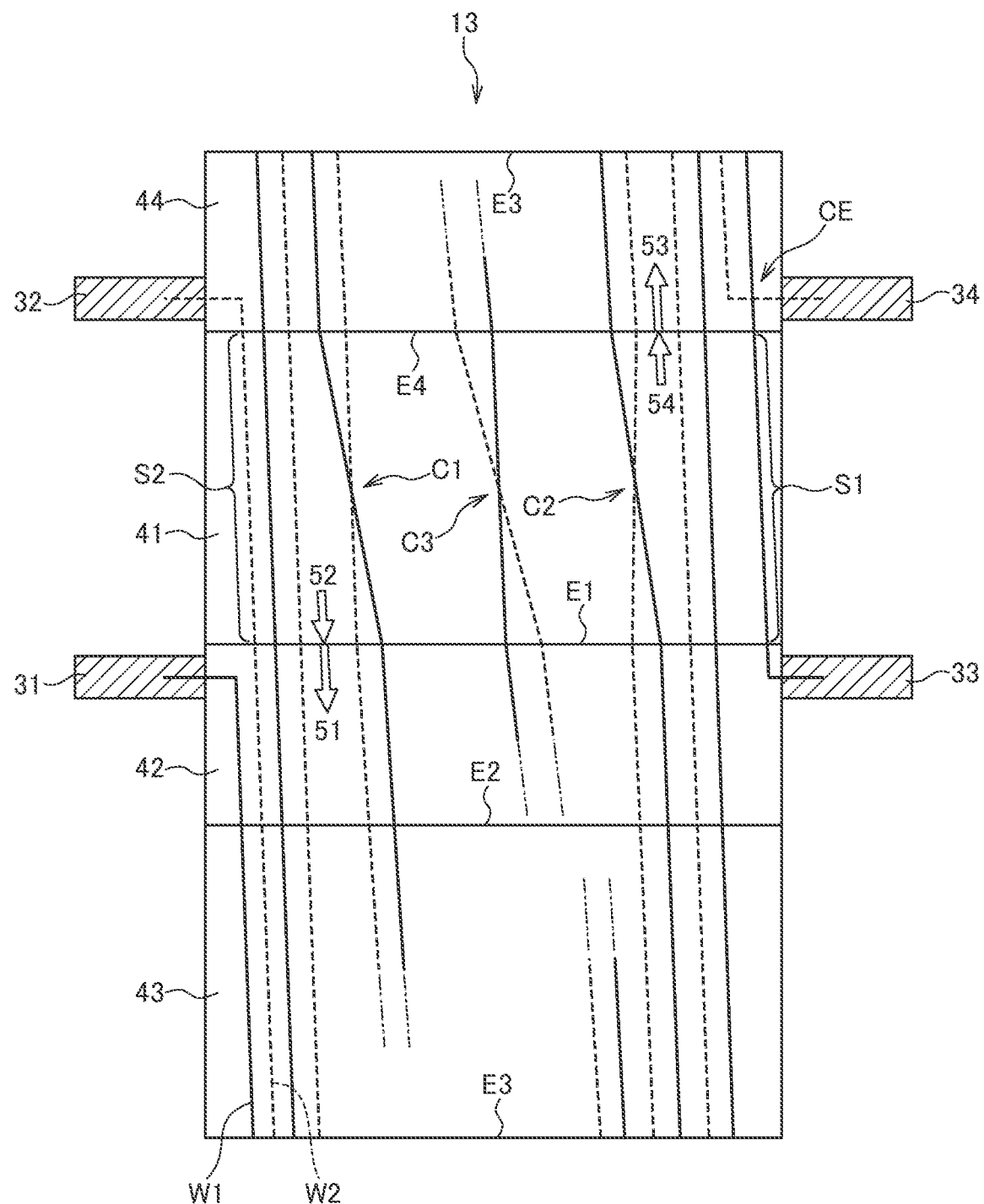
FIG. 5 is a schematic developed view for explaining the winding layout of the first and second wires W1 and W2 in the common mode filter 2 according to the second embodiment of the present invention.

FIG. 5 is a schematic developed view for explaining the winding layout of the first and second wires W1 and W2 in the common mode filter 2 according to the second embodiment.

As illustrated in FIG. 5, in the common mode filter 2 according to the second embodiment, the first to third crossing portions C1 to C3 are all positioned on the winding surface 41. If the first and second wires w1 and W2 are made to cross each other an odd number of times, the positional relationship between the first and second wires W1 and W2 at one end side and the positional relationship therebetween at the other end side are disadvantageously reversed. However, in the common mode filter 2 according to the present embodiment, the first turns of the first and second wires W1 and W2 counted from the other ends are made to cross each other at a crossing portion CE on the winding surface 44, so that the positional relationship between the first and second wires W1 and W2 at one end side and the positional relationship therebetween at the other end side coincide with each other.

As described above, in the common mode filter 2 according to the second embodiment, the symmetry between the first and second wires W1 and W2 is further enhanced, allowing the mode conversion characteristics to be further improved. When the total number of turns in the first and second layer winding portions L4 and L5 is even, half of the total number of turns is preferably assigned to each of the first and second layer winding portions L4 and L5 to make the numbers of turns in the first and second layer winding portions L4 and L5 coincide with each other. On the other hand, when the total number of turns in the first and second layer winding portions L4 and L5 is odd, the difference in the number of turns between the first and second layer winding portions L4 and L5 is preferably set to one to minimize the difference in the number of turns.

Figure 6:
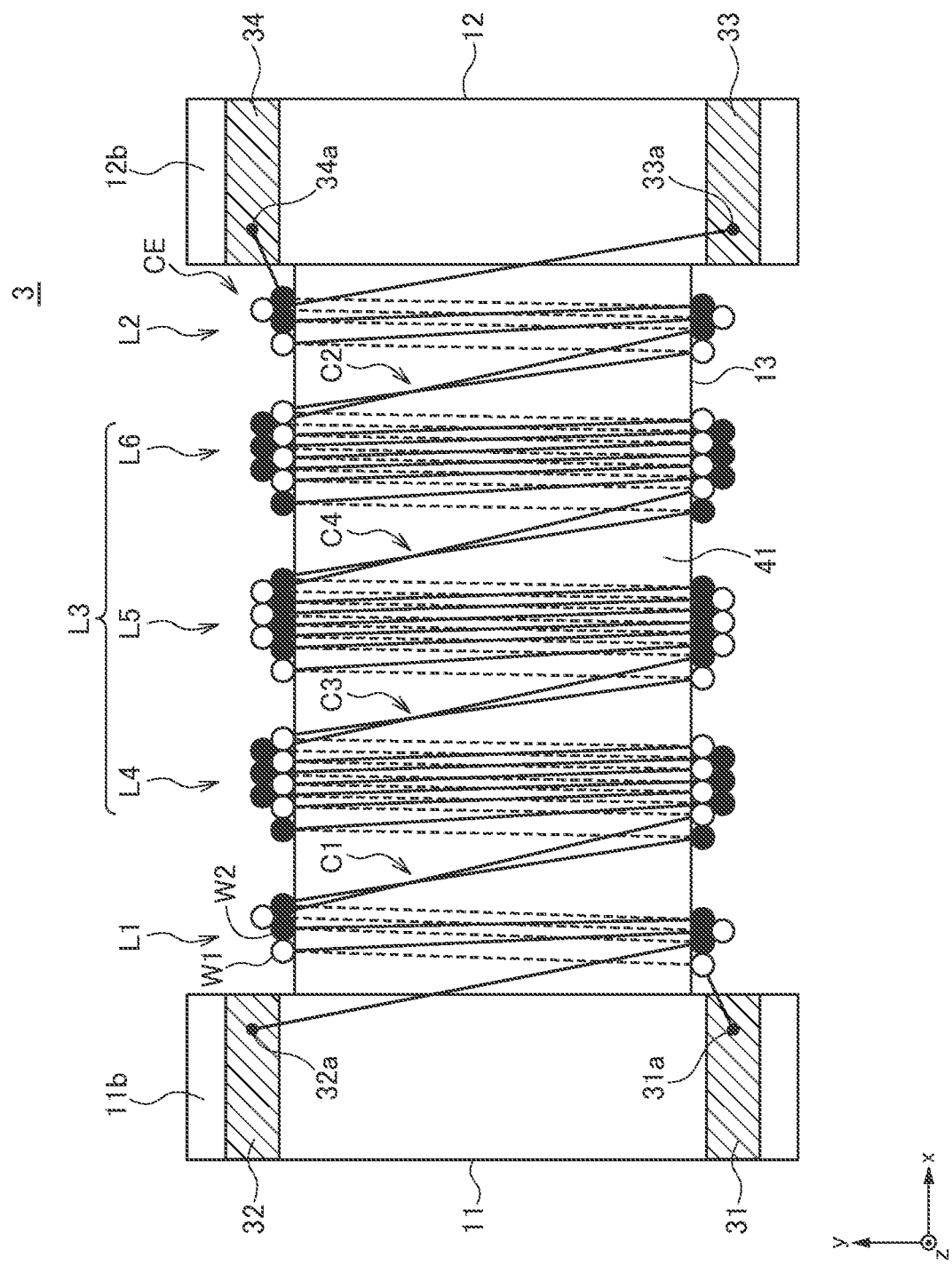
FIG. 6 is a schematic plan view for illustrating the winding layout of the first and second wires W1 and W2 in a common mode filter 3 according to a third embodiment of the present invention.

FIG. 6 is a schematic plan view for illustrating the winding layout of the first and second wires W1 and W2 in a common mode filter 3 according to a third embodiment.

As illustrated in FIG. 6, the common mode filter 3 according to the third embodiment differs from the common mode filter 2 according to the second embodiment in that the layer winding portion L3 is divided into fourth to sixth layer winding portions L4 to L6 and that a fourth crossing portion C4 is provided between the fifth and sixth layer winding portions L5 and L6. Other basic configurations are the same as those of the common mode filter 2 according to the second embodiment, so the same reference numerals are given to the same elements, and overlapping description will be omitted.

In the first, second, and fifth layer winding portions L1, L2, and L5, the first and second wires W1 and W2 are wound by layer winding in an aligned state with the second wire W2 positioned in the lower layer and the first wire W1 positioned in the upper layer. On the other hand, in the fourth and sixth layer winding portions L4 and L6, the first wire W1 is positioned in the lower layer and the second wire W2 is positioned in the upper layer. In the example of FIG. 6, the number of turns in each of the layer winding portions L4 to L6 is four, but not limited thereto. However, the number of turns in the fourth layer winding portion L4 and the number of turns in the sixth layer winding portion L6 are preferably made to coincide with each other. In the first layer winding portion L1, the first turn of the first wire W1 counted from the connection portion 31a is exceptionally positioned in the lower layer; in the fourth layer winding portion L4, the third turn of the second wire W2 counted from the connection portion 32a is exceptionally positioned in the lower layer; in the fifth layer winding portion L5, the seventh turn of the first wire W1 counted from the connection portion 31a is exceptionally positioned in the lower layer; in the sixth layer winding portion L6, the 11th turn of the second wire W2 counted from the connection portion 32a is exceptionally positioned in the lower layer; and in the second layer winding portion L2, the second turn of the first wire W1 counted from the connection portion 33a is exceptionally positioned in the lower layer.

As described above, the common mode filter 3 according to the third embodiment has the five layer winding portions L1, L2, L4 to L6, wherein the vertical positional relationship between the first and second wires W1 and W2 in the layer winding portions L1, L2 and L5 and the vertical positional relationship therebetween in the layer winding portions L4 and L6 are reversed, thus reducing the difference in length between the first and second wires W1 and W2. In addition, the first and second wires W1 and W2 cross each other between the fourth and fifth layer winding portions L4 and L5 and between the fifth and sixth layer winding portions L5 and L6, allowing the symmetry between the first and second wires W1 and W2 to be further enhanced.

Further, in the common mode filter 3 according to the third embodiment, the third layer winding portion L3 is divided into three, whereby a parasitic capacitance component is reduced. This makes it possible to further improve signal characteristics in high frequency regions.

It is apparent that the present invention is not limited to the above embodiments, but may be modified and changed without departing from the scope and spirit of the invention.

What is claimed is:

1. A common mode filter comprising:
   a core having a winding core part, a first flange part provided at one axial end of the winding core part, and a second flange part provided at other axial end of the winding core part;
   first and second wires wound in a same direction around the winding core part;
   first and second terminal electrodes provided on the first flange part and connected respectively with one ends of the first and second wires; and
   third and fourth terminal electrodes provided on the second flange part and connected respectively with other ends of the first and second wires,
   wherein the first and second wires have:
      a first layer winding portion in which first and second turns thereof counted respectively from the one ends are at least partially wound by layer winding in an aligned state;

a second layer winding portion in which first and second turns thereof counted respectively from the other ends are at least partially wound by layer winding in an aligned state;

a third layer winding portion in which at least parts of the first and second wires between a third turns thereof counted respectively from the one ends and a third turns thereof counted respectively from the other ends are wound by layer winding in an aligned state;

a first crossing portion positioned between the first and third layer winding portions, at which the first and second wires cross each other; and a second crossing portion positioned between the second and third layer winding portions, at which the first and second wires cross each other, wherein vertical positions of the first and second wires are reversed at least partially between the first and third layer winding portions, and wherein vertical positions of the first and second wires are reversed at least partially between the second and third layer winding portions.

2. The common mode filter as claimed in claim 1,
wherein the first flange part has a first surface covered with connection portions of the first and second terminal electrodes at which the one ends of the first and second wires are respectively connected,
wherein the second flange part has a second surface covered with connection portions of the third and fourth terminal electrodes at which the other ends of the first and second wires are respectively connected,
wherein the winding core part has a winding surface parallel to the first and second surfaces, and
wherein the first and second crossing portions are both positioned on the winding surface.

3. The common mode filter as claimed in claim 1,
wherein the third layer winding portion has a fourth layer winding portion positioned on a side close to the first layer winding portion and a fifth layer winding portion positioned on a side close to the second layer winding portion,
wherein the first and second wires further have a third crossing portion positioned between the fourth and fifth layer winding portions, at which the first and second wires cross each other, and
wherein a vertical positional relationship between the first and second wires in the first and fifth layer winding portions and a vertical positional relationship therebetween in the second and fourth layer winding portions are reversed.

4. The common mode filter as claimed in claim 3, wherein a difference in a number of turns between the fourth and fifth layer winding portions is one or less.

5. The common mode filter as claimed in claim 1,
wherein the third layer winding portion has a fourth layer winding portion positioned on a side close to the first layer winding portion, a sixth layer winding portion positioned on a side close to the second layer winding portion, and a fifth layer winding portion positioned between the fourth and sixth layer winding portions,
wherein the first and second wires further have a third crossing portion positioned between the fourth and fifth layer winding portions, at which the first and second wires cross each other and a fourth crossing portion positioned between the fifth and sixth layer winding portions, at which the first and second wires cross each other, and wherein a vertical positional relationship between the first and second wires in the first, second, and fifth layer winding portions and a vertical positional relationship therebetween in the fourth and sixth layer winding portions are reversed.

6. The common mode filter as claimed in claim 5, wherein a number of turns of the fourth layer winding portion and a number of turns of the sixth layer winding portion is a same.

7. A common mode filter comprising:
a core including a winding core part;
a first wire wound around the winding core part, the first wire having a first section including one end of the first wire, a second section including other end of the first wire, and a third section located between the first and second sections; and
a second wire wound around the winding core part, the second wire having a fourth section including one end of the second wire, a fifth section including other end of the second wire, and a sixth section located between the fourth and sixth sections,
wherein the first section of the first wire and the fourth section of the second wire is wound around the winding core part twice such that the first section of the first wire and the fourth section of the second wire form a first layer block,
wherein the second section of the first wire and the fifth section of the second wire is wound around the winding core part twice such that the second section of the first wire and the fifth section of the second wire form a second layer block,
wherein the sixth section of the second wire is wound on the third section of the first wire a plurality of times without crossing the third section of the first wire such that the third section of the first wire and the sixth section of the second wire form a third layer block,
wherein the first and second wires cross each other between the first and third layer blocks, and
wherein the first and second wires cross each other between the second and third layer blocks.

8. The common mode filter as claimed in claim 7,
wherein the first section of the first wire includes first and second turns,
wherein the fourth section of the second wire includes third and fourth turns, and
wherein the second turn is wound on the third and fourth turns.

9. The common mode filter as claimed in claim 8, wherein the first turn is directly wound on the winding core part without wound on the second wire.

10. The common mode filter as claimed in claim 9,
wherein the second section of the first wire includes fifth and sixth turns,
wherein the fifth section of the second wire includes seventh and eighth turns, and
wherein the sixth turn is wound on the seventh and eighth turns.

11. The common mode filter as claimed in claim 10, wherein the fifth turn is directly wound on the winding core part without wound on the second wire.

12. The common mode filter as claimed in claim 7,
wherein the first wire further has a seventh section located between the second and third sections,
wherein the second wire further has an eighth section located between the fifth and sixth sections,
wherein the seventh section of the first wire is wound on the eighth section of the second wire without crossing the eighth section of the second wire such that the seventh section of the first wire and the eighth section of the second wire form a fourth layer block, and wherein the first and second wires cross each other between the third and fourth layer blocks.

13. The common mode filter as claimed in claim 12, wherein a number of turns of the third section of the first wire is a same as a number of turns of the seventh section of the first wire, and wherein a number of turns of the sixth section of the second wire is a same as a number of turns of the eighth section of the second wire.

14. The common mode filter as claimed in claim 12, wherein the first wire further has a ninth section located between the second and seventh sections, wherein the second wire further has a tenth section located between the fifth and eighth sections, wherein the tenth section of the second wire is wound on the ninth section of the first wire without crossing the ninth section of the first wire such that the ninth section of the first wire and the tenth section of the second wire form a fifth layer block, and wherein the first and second wires cross each other between the fourth and fifth layer blocks.

15. The common mode filter as claimed in claim 14, wherein a number of turns of the third section of the first wire is a same as a number of turns of the ninth section of the first wire, and wherein a number of turns of the sixth section of the second wire is a same as a number of turns of the tenth section of the second wire.

16. The common mode filter as claimed in claim 15, wherein a number of turns of the third section of the first wire is a same as a number of turns of the seventh section of the first wire, and wherein a number of turns of the sixth section of the second wire is a same as a number of turns of the eighth section of the second wire.

\* \* \* \* \*